(12) United States Patent
Ishihara et al.

(10) Patent No.: US 7,902,731 B2
(45) Date of Patent: Mar. 8, 2011

(54) PIEZOELECTRIC RESONATOR DEVICE AND METHOD FOR MANUFACTURING THE SAME

(75) Inventors: Hiroyuki Ishihara, Kakogawa (JP); Manabu Ohnishi, Kakogawa (JP)

(73) Assignee: Daishinku Corporation, Kakogawa-shi (JP)

( * ) Notice: Subject to any disclaimer, the term of this patent is extended or adjusted under 35 U.S.C. 154(b) by 481 days.

(21) Appl. No.: 11/989,764

(22) PCT Filed: Jun. 28, 2006

(86) PCT No.: PCT/JP2006/312878
§ 371 (c)(1),
(2), (4) Date: Jan. 31, 2008

(87) PCT Pub. No.: WO2007/017992
PCT Pub. Date: Feb. 15, 2007

(65) Prior Publication Data
US 2010/0213794 A1    Aug. 26, 2010

(30) Foreign Application Priority Data

Aug. 10, 2005    (JP) ................................ 2005-231754

(51) Int. Cl.
*H01L 41/04* (2006.01)
(52) U.S. Cl. ...................................................... 310/370
(58) Field of Classification Search .................. 310/320, 310/368, 370
See application file for complete search history.

(56) References Cited

U.S. PATENT DOCUMENTS

| 6,806,797 B2 * | 10/2004 | Kikushima | 333/200 |
| 2003/0029239 A1 * | 2/2003 | Hatanaka et al. | 73/504.16 |
| 2006/0087205 A1 * | 4/2006 | Kikushima | 310/370 |

FOREIGN PATENT DOCUMENTS

| JP | 59-044118 | | 3/1984 |
| JP | 05-088028 | A | 11/1993 |
| JP | H08-330878 | A | 12/1996 |
| JP | 2001-053036 | A | 2/2001 |
| JP | 2001-223557 | A | 8/2001 |
| JP | 2004-015562 | | 1/2004 |
| JP | 2004-200910 | | 7/2004 |
| JP | 2004-200914 | | 7/2004 |
| JP | 2004-320297 | A | 11/2004 |

OTHER PUBLICATIONS

International Search Report mailed Oct. 3, 2006 for International Application No. PCT/JP2006/312878.

* cited by examiner

*Primary Examiner* — Derek J Rosenau
(74) *Attorney, Agent, or Firm* — Marvin A. Motsenbocker; Mots Law, PLLC

(57) ABSTRACT

With a crystal vibrator, a package (housing) is produced by joining a base to a lid, and an internal space is formed within this package. A crystal resonator plate is held on the base in this internal space, and the internal space of the package is sealed airtight. In placing the crystal resonator plate on the base, the +X axial direction of the crystal resonator plate within the internal space is set.

17 Claims, 4 Drawing Sheets

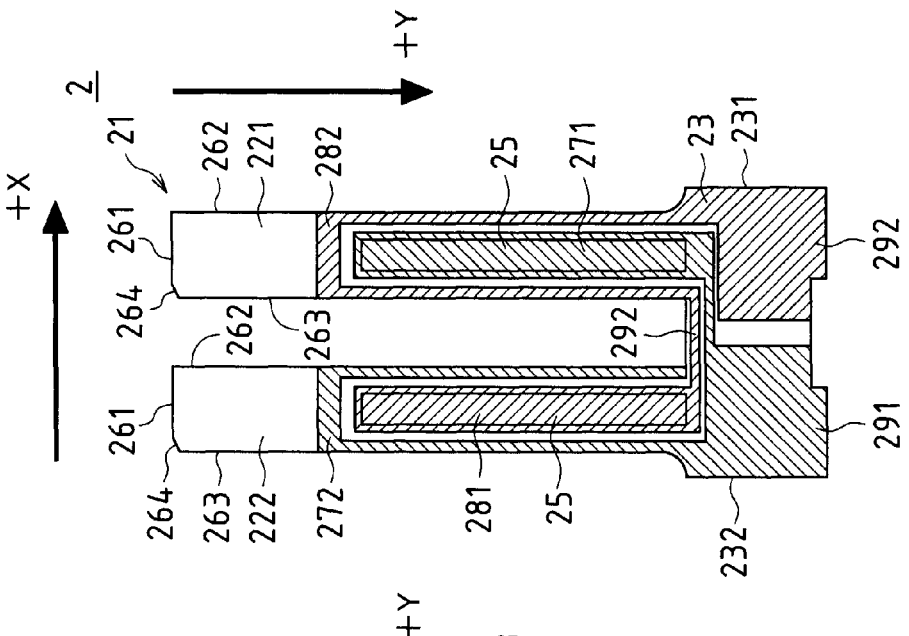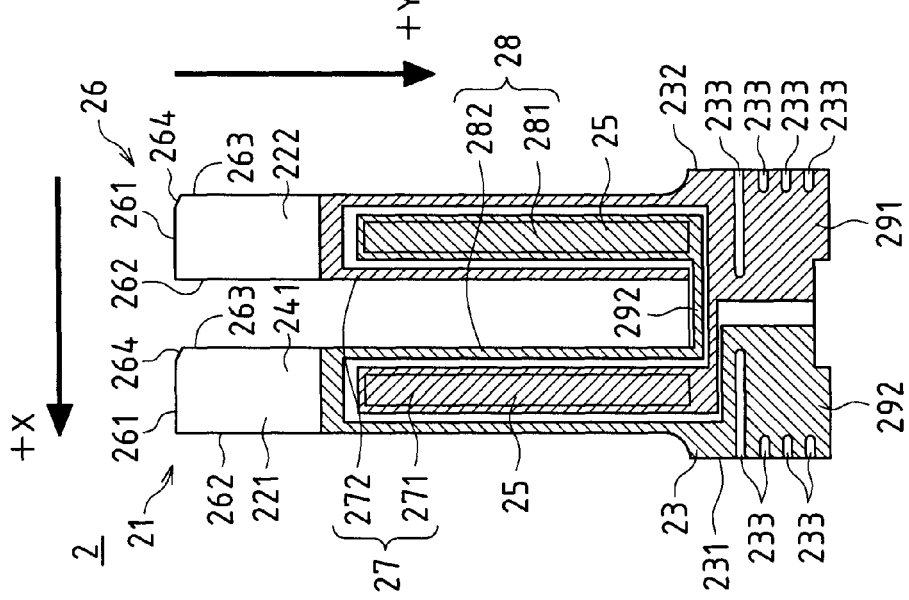

PIEZOELECTRIC RESONATOR DEVICE AND METHOD FOR MANUFACTURING THE SAME

TECHNICAL FIELD

The present invention relates to a piezoelectric resonator device and a method for manufacturing the same.

BACKGROUND ART

An example of the piezoelectric resonator devices currently used is a tuning fork-shaped crystal vibrator (hereinafter referred to as a crystal vibrator). With this type of piezoelectric resonator device, the housing is made up of a base and a lid, and the interior of the housing is sealed airtight. Also, inside this housing, a crystal resonator plate is joined to an electrode pad on the base via an electroconductive adhesive.

The substrate of this crystal resonator plate consists of a base component and two leg components protruding from the base component, and excitation electrodes having different potential are formed on the leg components. Also, in the substrate, a lead electrode for electrically connecting the excitation electrodes to the electrode pad is formed at the base component. This lead electrode is drawn from the excitation electrodes (see, for example, Patent Document 1).
Patent Document 1: JP 2004-200910A

DISCLOSURE OF INVENTION

Problem to be Solved by the Invention

When the above-mentioned crystal vibrator is dropped and the amount of change in the characteristics of the crystal vibrator (such as frequency and resistance (CI value)) before and after the drop are measured in order to ascertain the impact resistance of the crystal vibrator, the drop impact results in a change in the characteristics of the crystal vibrator before and after the drop. In particular, the frequency change is attributable to the state of adhesion between the electrode pad and the crystal resonator plate that are bonded via a conductive adhesive, with the frequency becoming lower.

In view of this, in an effort to solve the above problems, it is an object of the present invention to provide a piezoelectric resonator device with reduced change in frequency upon impact, and a method for manufacturing this device.

Means for Solving Problem

In order to achieve the stated object, the piezoelectric resonator device according to the present invention is a piezoelectric resonator device in which a package having an internal space is made up of a base and a lid, and a piezoelectric resonator plate is held on the base inside the internal space, wherein the +X axial direction of the piezoelectric resonator plate in the internal space is set.

With the present invention, since the +X axial direction of the piezoelectric resonator plate within the internal space is set, it is possible to suppress the change in frequency that occurs upon impact. Also, since there are no restrictions on the other axial directions (such as the ±Y axis or ±Z axis) with the present invention, the other axial directions can be set as desired. This affords greater latitude in the design of how the piezoelectric resonator plate is held within the internal space. The phrase "+X axial direction" as used herein includes +X axial directions that are tilted by a few degrees from the actual +X axial direction. Specifically, a deviation from the +X axial direction that can still be distinguished as the +X axial direction from other axial directions is included in the definition of the +X axial direction used in the present invention, but the +X axial direction without any deviation is still preferable.

In the above constitution, an identification portion for identifying the +X axial direction may be provided to the piezoelectric resonator plate.

In this case, since an identification portion for identifying the +X axial direction is provided to the piezoelectric resonator plate, the position where the piezoelectric resonator plate is held in the internal space can be easily set on the basis of the +X axial direction. Accordingly, the position where the piezoelectric resonator plate is held will be mistaken less often, which results in a higher yield.

With the above constitution, the piezoelectric resonator plate may be made up of a base component and a plurality of leg components that protrude from this base component, and the identification portion may be provided to the protruding ends of the leg components.

In this case, since the piezoelectric resonator plate is made up of a base component and a plurality of leg components that protrude from this base component, and the identification portion is provided to the protruding ends of the leg components, the entire piezoelectric resonator plate does not need to be identified in order to identify the +X axial direction, and what is to be identified can be limited to just the protruding ends. As a result, the +X axial direction of the piezoelectric resonator plate can be identified more easily.

With the above constitution, the protruding ends may include a protruding end face and ±X axial side faces, and the identification portion may be a notch formed extending from the protruding end face to the –X axial side face.

More specifically, the identification portion is the above-mentioned notch formed extending from the protruding end face to the –X axial side face. In this case, the +X axial direction of the piezoelectric resonator plate can be easily identified by recognizing the position of the notches in the protruding ends.

With the above constitution, the piezoelectric resonator plate may be made up of a base component and a plurality of leg components that protrude from the base component, excitation electrodes having different potential may be formed on the leg components, lead electrodes that are drawn from the excitation electrodes in order to electrically connect the excitation electrodes with external electrodes at the base component may be formed on the base component and the leg components, and a groove may be formed in the front main face of the base component from at least one side face in the ±X axial directions.

In this case, because the piezoelectric resonator plate is made up of a base component and a plurality of leg components that protrude from the base component, and the excitation electrodes are formed on the leg components, and the lead electrodes are formed on the base component and the leg components, and a groove is formed in the front main face of the base component from at least one side face in the ±X axial directions, this constitution is preferable for reducing the change in frequency upon impact. More specifically, since the groove is formed perpendicular to the excitation direction, the groove can reduce vibration leakage that spreads outward from the leg components via the base component.

With the above constitution, a plurality of the grooves may be formed in the front main face of the base component in the ±Y axial directions.

In this case, since a plurality of grooves are formed in the front main face of the base component in the ±Y axial directions, vibration leakage that spreads outward from the leg components via the base component can be reduced by the plurality of grooves. Also, with the present invention, since a plurality of grooves are formed in the ±Y axial directions, vibration leakage that spreads outward from the leg components via the base component can be reduced better than when just a single groove is formed. Further, with the present invention, since a plurality of grooves are formed in the ±Y axial directions, it is assumed that the size of each groove in the ±Y axial directions will be set shorter than when just a single groove is formed. In this case, the strength of the base component of the piezoelectric resonator plate according to the present invention can be increased over that when just a single groove is formed.

With the above constitution, the length of at least one of the grooves in the ±X axial directions is greater than the length in the ±X axial directions of the other grooves adjacent on the ±Y axial direction sides.

In this case, since the length of at least one of the grooves in the ±X axial directions is greater than the length in the ±X axial directions of the other grooves adjacent on the ±Y axial direction sides, it is possible to ensure a region for forming the lead electrodes formed on the front main face of the base component. Accordingly, it is possible to prevent short circuiting of the lead electrodes caused by the formation of the grooves.

With the above constitution, the lead electrodes and external electrodes may be electrically connected at opposing locations on the rear main face of the base component across from the locations where the grooves are formed in the front main face.

In this case, since the lead electrodes and external electrodes are electrically connected at opposing locations on the rear main face of the base component across from the locations where the grooves are formed in the front main face, it is possible to suppress the effect on temperature characteristics due to the conduction surface area of the electrodes. It is also possible to reduce variance in the frequency of normal temperature deviation in the manufacturing process.

Specifically, when the grooves are formed at the opposing locations on the rear main face across from the locations where the grooves are formed in the front main face, the external electrodes are bonded not only to the lead electrodes, but also to the substrate undercoating (including an electro-conductive adhesive if one is interposed). No electrode is formed inside the grooves. The surface area of the lead electrodes here is reduced, and as a result the conduction surface area produced by a conductive adhesive between the lead electrodes and the external electrodes is reduced, so temperature characteristics tend to be adversely affected. The temperature characteristics referred to here are characteristics indicating fluctuation in resistance with respect to temperature changes (the CI value when crystal is used for the substrate), and there was a problem in that resistance varied sharply (jumped) at some temperatures. In contrast, with the present invention, since the grooves are not formed at the opposing locations on the rear main face across from the locations where the grooves are formed in the front main face, the above problem is not encountered, and the effect on temperature characteristics can be reduced.

To achieve the stated object, the method for manufacturing a piezoelectric resonator device according to the present invention is a method for manufacturing a piezoelectric resonator device in which a package having an internal space is made up of a base and a lid, and a piezoelectric resonator plate is held on the base inside the internal space, comprising a setting step of setting an +X axial direction of the piezoelectric resonator plate in the internal space, and a holding step of holding the piezoelectric resonator plate on the base while the +X axial direction of the piezoelectric resonator plate is aligned with the +X axial direction set in the setting step.

With the present invention, because the setting step and the holding step are provided, fluctuation in frequency upon impact can be suppressed. Also, since there are no restrictions on the other axial directions (such as the ±Y axes or ±Z axes) with the present invention, the other axial directions can be set as desired. This affords greater latitude in the design of how the piezoelectric resonator plate is held within the internal space.

The above method may also include an identification step of identifying the +X axial direction of the piezoelectric resonator plate.

In this case, because the identification step is provided, the position where the piezoelectric resonator plate is held in the internal space can be easily set on the basis of the +X axial direction. Accordingly, the position where the piezoelectric resonator plate is held will be mistaken less often, which results in a higher yield.

EFFECTS OF THE INVENTION

With the piezoelectric resonator device and the method for manufacturing the same according to the present invention, it is possible to suppress frequency fluctuation upon impact.

BRIEF DESCRIPTION OF DRAWINGS

FIG. 3a is a simplified plan view of the crystal resonator plate according to a working example, and FIG. 3b is a simplified rear view of the crystal resonator plate according to this working example;

Figure 1:
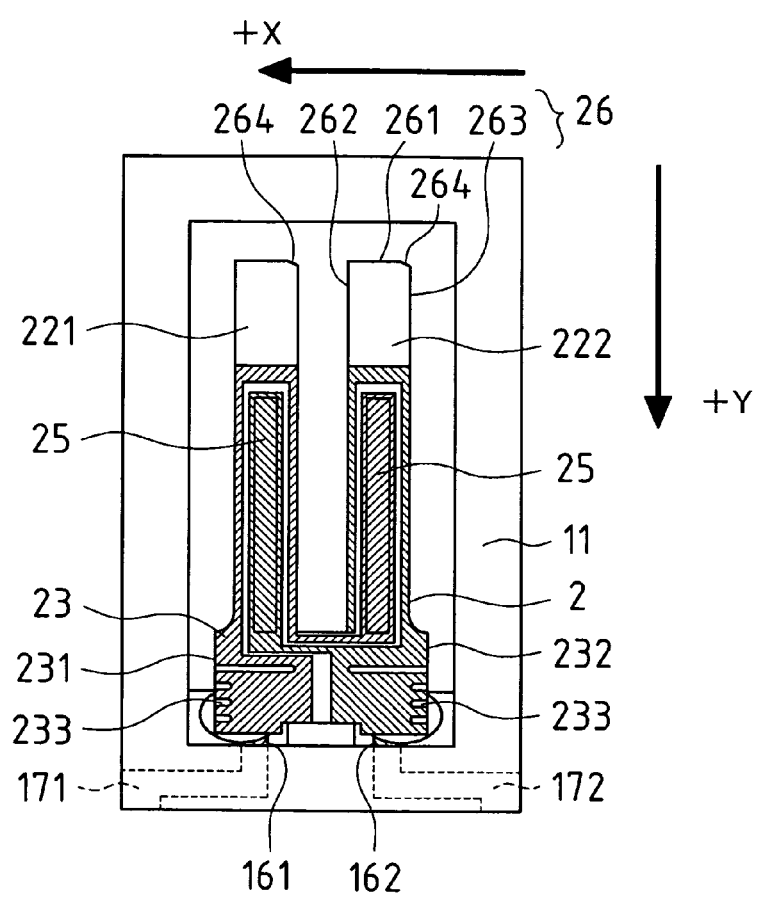
FIG. 1 is a simplified plan view of a crystal vibrator according to a working example of the present invention with the lid removed.

| Description of Reference Numerals | |
|---|---|
| 1 | crystal vibrator (piezoelectric resonator device) |
| 11 | base |
| 12 | lid |
| 13 | internal space |
| 2 | crystal resonator plate (piezoelectric resonator plate) |
| 221 and 222 | first and second leg components (leg components) |
| 23 | base component |
| 231 and 232 | both side faces of base component (side faces of base component) |
| 233 | groove |
| 241 | front main face |
| 242 | rear main face |
| 26 | protruding end |
| 261 | protruding end face |
| 262 and 263 | ±X axial side faces |
| 264 | notch |
| 27 and 28 | first and second excitation electrodes (excitation electrodes) |
| 291 and 292 | lead electrodes |

BEST MODE FOR CARRYING OUT THE INVENTION

Embodiments of the present invention will now be described through reference to the drawings. The working examples given below are cases of applying the present invention to a tuning fork-shaped crystal vibrator as a piezoelectric resonator device.

Figure 2:
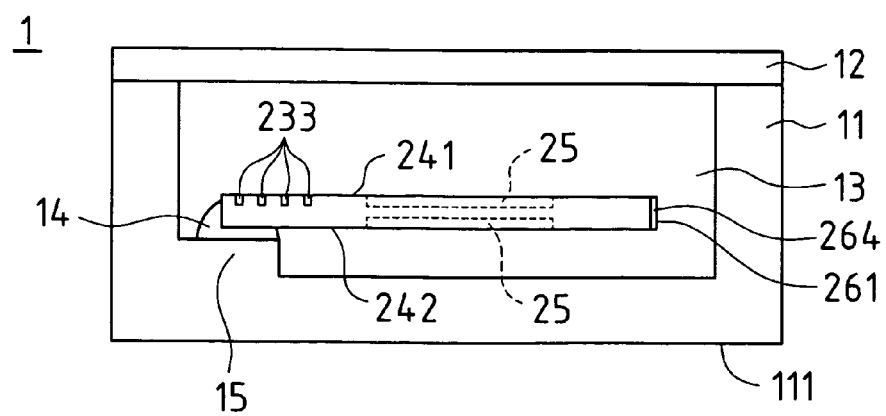
FIG. 2 is a simplified side view showing the internal space of the crystal vibrator according to a working example.

As shown in FIGS. 1 and 2, a tuning fork-shaped crystal vibrator 1 (hereinafter referred to simply as a crystal vibrator) according to a working example includes a tuning fork-shaped crystal resonator plate 2 (referred to in the present invention as a piezoelectric resonator plate, and hereinafter referred to as a crystal resonator plate) formed by photolithography, a base 11 that holds this crystal resonator plate 2, and a lid 12 for airtightly sealing the crystal resonator plate 2 held on the base 11.

As shown in FIGS. 1 and 2, with this crystal vibrator 1, a package (housing) is produced by joining the base 11 to the lid 12, and an internal space 13 is formed within this package. The crystal resonator plate 2 is held on the base 11 in this internal space 13, and the internal space 13 of the package is airtightly sealed. The base 11 and the crystal resonator plate 2 here are joined using an electroconductive adhesive 14.

The constitution of the crystal vibrator 1 will now be described.

As shown in FIGS. 1 and 2, the base 11 is formed in the shape of a box made up of a bottom portion and wall portions that extend upward from the bottom part. This base 11 is produced by laminating a cuboid ceramic material over a single plate of ceramic material that is rectangular in plan view, and then integrally firing the parts to create a concave shape. The wall portions are formed along the outer periphery of the front face of the bottom part. The upper faces of the wall portions are the area joined with the lid 12, and a metallization layer (not shown) is provided to this joining area for joining with the lid 12.

As shown in FIG. 2, a step 15 is formed on a side wall within the internal space 13 of the base 11 produced by laminating ceramic materials and integrally firing them in a concave shape, electrode pads 161 and 162 (discussed below) are formed on this step 15, and the crystal resonator plate 2 is held at one end and provided to these electrode pads 161 and 162.

The electrode pads 161 and 162, which electrically connect with excitation electrodes 27 and 28 (discussed below) of the crystal resonator plate 2, are formed on the front face of the step 15 of the base 11 in the internal space 13. These electrode pads 161 and 162 are electrically connected to terminal electrodes (not shown) formed on the rear face 111 of the base 11 via lead electrodes 171 and 172, respectively, and these terminal electrodes are connected to the external electrodes of an external component or external device. The terminal electrodes, the electrode pads 161 and 162, and the lead electrodes 171 and 172 are formed by printing with tungsten, molybdenum, or another such metallization material, and then firing integrally with the base 11. Nickel plating is formed over the top of the metallization on part of the terminal electrodes, the electrode pads 161 and 162, and the lead electrodes 171 and 172, and gold plating is formed over this nickel plating.

The lid 12 is composed of a metal material, and as shown in FIG. 2, is formed as a single plate that is rectangular in plan view. This lid 12 has solder (not shown) formed on its underside, and is joined to the base 11 by seam welding, beam welding, or another such process, to create a package of the crystal vibrator 1 from the lid 12 and the base 11. The internal space 13 referred to in this working example refers to the region that is airtightly sealed by the lid 12 and the base 11. The lid 12 may instead be made of a ceramic material, and airtightly sealed via a glass material.

Silicon containing a plurality of silver fillers is used for the electroconductive adhesive 14, and the electroconductive adhesive 14 is cured to bind the plurality of silver fillers into an electroconductive substance.

Next, the constitution of the crystal vibrator 1 disposed in the internal space 13 will be described.

As shown in FIGS. 1 to 3, the crystal resonator plate 2 is a tuning fork-shaped crystal resonator plate, and is formed by etching from a substrate 21, which is a crystal piece made of a different anisotropic material.

The substrate 21 is made up of two leg components 221 and 222 (first leg component and second leg component) and a base component 23, and is formed with the two leg components 221 and 222 protruding from the base component 23.

A concave groove 25 is formed on both main faces (front main face 241 and rear main face 242) of the first and second leg components 221 and 222 in order to improve the CI value, which deteriorates when the size of the crystal vibrator 1 is reduced.

Further, an identification portion for identifying the +X axial direction is provided to the crystal resonator plate 2. This identification portion is provided to the protruding ends 26 of the first and second leg components 221 and 222. The protruding ends referred to here are each made up of a protruding end face 261, ±X axial side faces 262 and 263 (the left side face of each of the first and second leg components 221 and 222 shown in FIG. 3a is the +X axial side face 262, while the right side face is the −X axial side face 263), and front and rear main faces 241 and 242. The identification portion is a notch 264 formed from the protruding end face 261 to the −X axial side face 263. The phrase "+X axial direction" as used herein includes +X axial directions that are tilted by a few degrees from the actual +X axial direction. Specifically, a deviation from the +X axial direction that can still be distinguished as the +X axial direction from other axial directions is included in the definition of the +X axial direction used in this working example, but the +X axial direction without any deviation is still preferable.

The two excitation electrodes 27 and 28 (first excitation electrode and second excitation electrode), which have different potential, and lead electrodes 291 and 292 for electrically connecting these first and second excitation electrodes 27 and 28 to the electrode pads 161 and 162 are formed on the front main face 241 of the crystal resonator plate 2, and the lead electrodes 291 and 292 are drawn from the first and second excitation electrodes 27 and 28. The lead electrodes 291 and 292 and the electrode pads 161 and 162 are joined via the electroconductive adhesive 14, so that the lead electrodes 291 and 292 and the electrode pads 161 and 162 are electrically connected.

As shown in FIG. 3, the first excitation electrode 27 is made up of a first main face electrode 271 formed on the front and rear main faces 241 and 242 of the first leg component 221, and a second side face electrode 272 formed on both side faces (such as opposing side faces) of the second leg component 222. The first main face electrode 271 and the second side face electrode 272 are connected by the lead electrode 291.

Similarly, as shown in FIG. 3, the second excitation electrode 28 is made up of a second main face electrode 281 formed on the front and rear main faces 241 and 242 of the second leg component 222, and a first side face electrode 282 formed on both side faces (such as opposing side faces) of the first leg component 221. The second main face electrode 281 and the first side face electrode 282 are connected by the lead electrode 292.

The above-mentioned first and second excitation electrodes 27 and 28 are, for example, laminated thin films made up of a chromium underlying electrode layer and a gold upper electrode layer. These thin films are formed over the entire surface by vacuum vapor deposition or another such process, and then subjected to metal etching by photolithography to form the desired shape. The above-mentioned lead electrodes 291 and 292 are, for example, laminated thin films made up of a chromium underlying electrode layer, a gold intermediate electrode layer, and a chromium upper electrode layer. These thin films are formed over the entire surface by vacuum vapor deposition or another such process, then subjected to metal etching by photolithography to form the desired shape, and just the chromium upper electrode layer is formed by vacuum vapor deposition or the like with partial masking.

As shown in FIG. 3a, grooves 233 are formed in the front main face 241 of the base component 23, from the side ends 231 and 232, along the ±X axial directions. Four of the grooves 233 are formed along the ±Y axial directions in the side ends 231 and 232.

The length of at least one of the grooves 233 in the ±X axial directions is greater than the length in the ±X axial directions of the other grooves 233 adjacent on the ±Y axial direction sides. More specifically, the length in the ±X axial directions of the grooves 233 formed on the leg component side of the base component 23 is greater than the length in the ±X axial directions of the other grooves 233.

The lead electrodes 291 and 292 are drawn to opposing locations on the rear main face 242 of the base component 23 across from the locations where the grooves 233 are formed in the front main face 241 of the base component 23, and the lead electrodes 291 and 292 and the electrode pads 161 and 162 are electrically connected via the electroconductive adhesive 14 at opposing locations on the rear main face 242 of the base component 23. The phrase "opposing locations on the rear main face 242 of the base component 23 across from the locations where the grooves 233 are formed" as used in this working example refers to opposing locations on the rear main face of the base component 23 corresponding to the grooves 233 (see FIG. 3).

Next, the placement of the above-mentioned crystal resonator plate 2 in the package will be described through reference to the drawings.

The crystal resonator plate 2 is disposed on the base 11 constituted as above. At this time, the +X axial direction of the crystal resonator plate 2 inside the internal space 13 is set for the placement of the crystal resonator plate 2 on the base 11 (what is called the setting step in the present invention). In this working example, the disposition of the crystal resonator plate 2 in the internal space 13 is set in the direction indicated in FIG. 1 by the +X axial direction of the crystal resonator plate 2. More specifically, when the crystal resonator plate 2 in the internal space 13 is held at one end by the base component 23 with respect to the base 11, and the base component 23 of the crystal resonator plate 2 that is thus held at one end is disposed on the lower side of the base 11 when the base 11 is viewed in plan view as shown in FIG. 1, the +X axial direction of the crystal resonator plate is set in a direction facing from the right side to the left side of the base 11. Also, the +X axial direction of the crystal resonator plate 2 is determined by using the above-mentioned identification portion (the notch 264) (this is called the identification step in the present invention).

Then, the +X axial direction of the crystal resonator plate 2 is aligned with the +X axial direction set in the setting step, and the crystal resonator plate 2 is held on the base 11 (called the holding step in the present invention). In this holding step, the lead electrodes 291 and 292 of the crystal resonator plate 2 and the electrode pads 161 and 162 of the base 11 are joined with the electroconductive adhesive 14, and as shown in FIG. 1, the crystal resonator plate 2 is held at one end at the base component 23 on the base 11.

After the holding step, the lid 12 is placed on the top face of the wall portions of the base 11, and the lid 12 and the base 11 are joined with solder by seam welding, beam welding, or another such process to manufacture the crystal vibrator 1 shown in FIG. 2. The internal space 13 of this crystal vibrator 1 is sealed airtight.

As discussed above, with the crystal vibrator 1 according to this working example, since the +X axial direction of the crystal resonator plate 2 in the internal space 13 is set ahead of time, it is possible to suppress frequency fluctuation upon impact. Also, with the crystal resonator plate 2 according to this working example, since the direction in which the crystal resonator plate 2 is disposed in the internal space 13 is not limited in the other axial directions (such as the ±Y axis or the ±Z axis), the other axial directions can be set as desired. As a result, this affords greater latitude in the design of how the crystal resonator plate 2 is held within the internal space 13.

Also, since an identification portion for identifying the +X axial direction is provided to the crystal resonator plate 2, the position where the crystal resonator plate 2 is held in the internal space can be easily set on the basis of the +X axial direction. Accordingly, the position where the crystal resonator plate 2 is held will be mistaken less often, which results in a higher yield.

Also, since the crystal resonator plate 2 is made up of the base component 23 and the first and second leg components 221 and 222, and the identification portion is provided to the protruding ends 26 of the first and second leg components 221 and 222, the entire crystal resonator plate 2 does not need to be identified in order to identify the +X axial direction, and what is to be identified can be limited to just the protruding ends 26. As a result, the +X axial direction of the crystal resonator plate 2 can be identified more easily.

More specifically, the identification portion is the notch 264 formed extending from the protruding end face 261 to the −X axial side face 263. In this case, the +X axial direction of the crystal resonator plate 2 can be easily identified by recognizing the position of the notches 264 in the protruding ends 26.

Also, since the crystal resonator plate 2 is made up of the base component 23 and the first and second leg components 221 and 222, and the first and second excitation electrodes 27 and 28 are formed on the first and second leg components 221 and 222, the lead electrodes 291 and 292 are formed on the base component 23 and the first and second leg components 221 and 222, and the grooves 233 are formed in the front main face 241 of the base component 23 from side ends 231 and 232 in the ±X axial directions, this constitution is preferable for reducing the change in frequency upon impact. More specifically, since eight of the grooves 233 are formed perpendicular to the excitation direction, the grooves 233 can reduce vibration leakage that spreads from the first and second leg components 221 and 222 to the base component 23.

Also, since eight grooves are formed in the ±Y axial directions near the front main face 241 of the base component 23, including both side ends 231 and 232 thereof, the eight grooves 233 can reduce vibration leakage that spreads outward from the first and second leg components 221 and 222 via the base component 23. Also, with this working example, since eight of the grooves 233 are formed in the ±Y axial directions, this constitution is better at reducing vibration leakage that spreads outward from the first and second leg components 221 and 222 via the base component 23 than when a single groove 233 is formed. Furthermore, with this working example, since eight of the grooves 233 are formed in the ±Y axial directions, it is assumed that the size of each groove 233 in the ±Y axial directions will be set shorter than when just a single groove 233 is formed. In this case, the strength of the base component 23 of the crystal resonator plate 2 according to this working example can be increased over that when just a single groove 233 is formed.

Also, since the grooves 233 formed on the leg component side of the base component 23 have a length in the ±X axial directions that is greater than the length in the ±X axial directions of the other grooves 233 adjacent on the ±Y axial direction sides, it is possible to ensure a region for forming the lead electrodes 291 and 292 formed on the front main face 241 of the base component 23. Accordingly, it is possible to prevent short circuiting of the lead electrodes 291 and 292 caused by the formation of the grooves 233.

Also, since the lead electrodes 291 and 292 and the electrode pads 161 and 162 are electrically connected at opposing locations on the rear main face 242 across from the locations where the grooves 233 are formed in the front main face 241 of the base component 23, it is possible to suppress the effect on temperature characteristics due to the conduction surface area of the electrodes. It is also possible to reduce variance in the frequency of normal temperature deviation in the manufacturing process.

Specifically, when the grooves 233 are formed at the opposing locations on the rear main face 242 across from the locations where the grooves 233 are formed in the front main face 241, the electrode pads 161 and 162 or the electroconductive adhesive 14 is bonded not only to the lead electrodes 291 and 292, but also to the substrate undercoating. No electrode is formed inside the grooves 233. The surface area of the lead electrodes 291 and 292 here is reduced, and as a result the conduction surface area produced by the electroconductive adhesive 14 between the lead electrodes 291 and 292 and the electrode pads 161 and 162 is reduced, so temperature characteristics tend to be adversely affected. The temperature characteristics referred to here are characteristics indicating fluctuation in resistance with respect to temperature changes (the CI value when crystal is used for the substrate), and there was a problem in that resistance varied sharply (jumped) at some temperatures. In contrast, with this working example, since the grooves 233 are not formed at opposing locations on the rear main face 242 across from the locations where the grooves 233 are formed in the front main face 241, the above problem is not encountered, and the effect on temperature characteristics can be reduced.

Because the method for manufacturing the crystal vibrator 1 according to this working example includes a setting step and a holding step, the change in frequency upon impact can be reduced. Also, with the crystal resonator plate 2 according to this working example, since the direction of orientation inside the internal space 13 is not limited to other axial directions (such as the ±Y axes or ±Z axes), the other axial directions can be set as desired. For instance, the axis of orientation as shown in FIG. 1 from the first and second leg components 221 and 222 of the crystal resonator plate 2 toward the base component 23 may be the −Y axis rather than the +Y axis. As a result, this affords greater latitude in the design of how the crystal resonator plate 2 is held within the internal space 13.

Also, because the identification step is provided, the position where the crystal resonator plate 2 is held in the internal space 13 can be easily set on the basis of the +X axial direction. Accordingly, the position where the crystal resonator plate 2 is held will be mistaken less often, which results in a higher yield.

Furthermore, there are two leg components (first and second) 221 and 222 in this working example, but the number is not limited to this as long as there are a plurality of leg components. For instance, there may be four leg components.

Also, in this working example the grooves 233 are formed in the front main face 241 of the base component, from the side ends 231 and 232, along the ±X axial directions, but this is just a favorable example, and the present invention is not limited to this. The action and effect of the present invention can be obtained by forming the grooves 233 in either of the ±X axial directions from either of the side faces.

Also, in this working example, four of the grooves 233 are formed in each of the side ends 231 and 232 (for a total of eight grooves), along the ±Y axial directions, but the number of grooves 233 is not limited to this and can be set as desired.

Also, in this working example the grooves 233 are formed in the front main face 241 of the base component, from the side ends 231 and 232, along the ±X axial directions, but this is just a favorable example, and the grooves 233 may be formed in the vicinity of the side ends 231 and 232, or does not need to be formed exactly from the side ends 231 and 232 themselves in the ±X axial directions.

Figure 4:
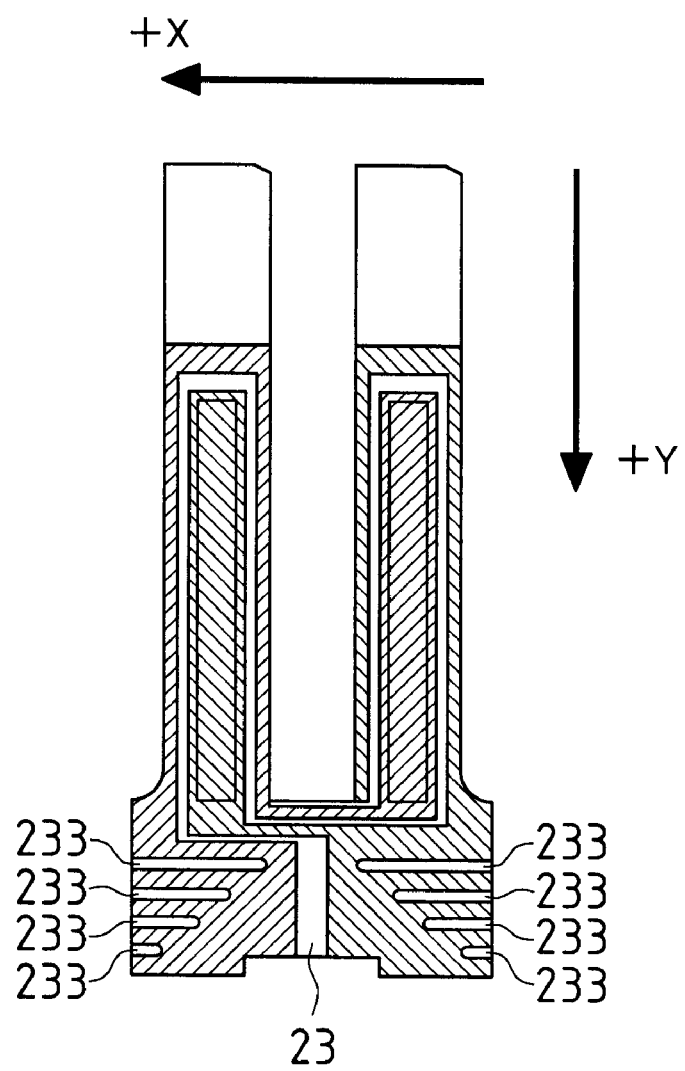
FIG. 4 is a simplified plan view of the crystal resonator plate according to another working example.

Also, in this working example the grooves 233 formed on the leg component side of the base component 23 have a length in the ±X axial directions that is greater than the length in the ±X axial directions of the other grooves 233, but the present invention is not limited to this, and just at least one of the grooves 233 may have a length in the ±X axial directions that is greater than the length in the ±X axial directions of the other grooves 233 adjacent on the −Y axial direction side. For example, the grooves 233 may be as shown in FIG. 4. With the grooves 233 shown in FIG. 4, the length of all the grooves 233 in the ±X axial directions is set to be greater than the length in the ±X axial directions of the other grooves 233 adjacent on the −Y axial direction side.

Also, in this working example the opposing locations on the rear main face 242 of the base component 23 across from the locations where the grooves 233 are formed are opposing locations on the rear main face of the base component 23 corresponding to the grooves 233, but the present invention is not limited to this, and the opposing locations of the rear main face of the base component 23 corresponding to the grooves 233, and the nearby area thereof, may be opposing locations on the rear main face 242 of the base component 23 across from the locations where the grooves 233 are formed.

Also, in this working example eight of the grooves 233 are formed in the base component 23 in a direction perpendicular to the vibration direction, but this is just an example that is favorable for suppressing frequency fluctuation upon impact, and the form of the base component 23 is not limited to that shown in FIGS. 1 to 4, and any configuration of the base component 23 can be used as long as it reduces fluctuation in frequency upon impact. For instance, the other working example given below may be used.

Also, in this working example the size of the base component 23 in the width direction (the ±X axial directions) is designed to be wider than the leg components 221 and 222, but the present invention is not limited to this, and the sizes of the leg components 221 and 222 and the base component 23 may be the same in the width direction (the ±X axial directions). For instance, the other working example given below may be used.

Also, in this working example the direction of orientation of the crystal resonator plate 2 in the internal space 13 is the direction shown in FIG. 1, but the present invention is not limited to this, and the direction of orientation of the crystal resonator plate 2 in the internal space 13 may be as discussed in the other working example given below.

Figure 5:
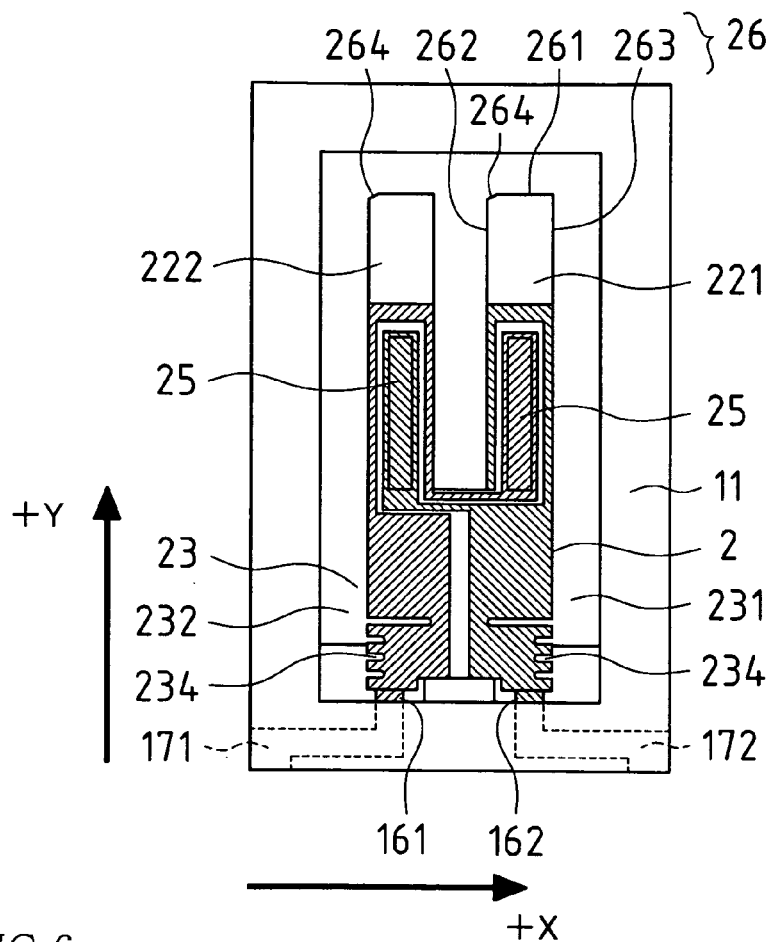
FIG. 5 is a simplified plan view of the crystal vibrator in yet another working example, with the lid removed.
Figure 6:
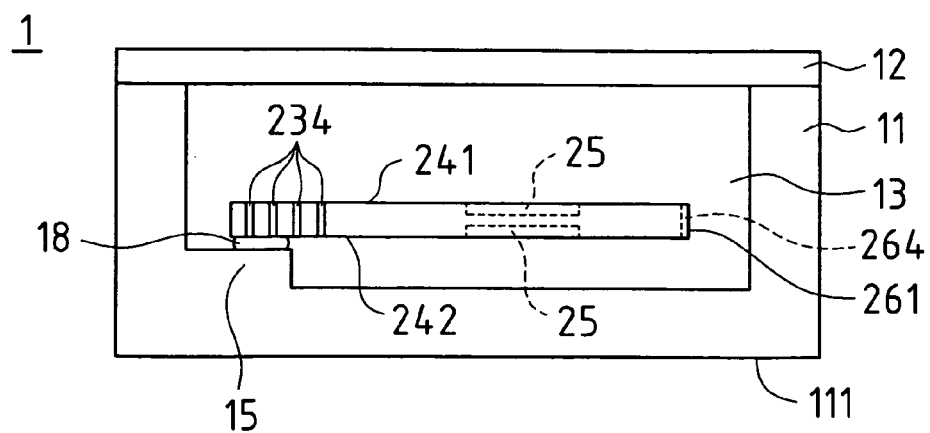
FIG. 6 is a simplified side view showing the internal space of the crystal vibrator according to another working example.

As shown in FIGS. 5 and 6, in another working example, the shape of the substrate 21 of the crystal resonator plate 2, the type of adhesive, and the direction of orientation of the crystal resonator plate 2 in the internal space 13 of the crystal vibrator 1 are different from those in the above working example. In view of this, only the portions of the other working example that are different from those in Working Example 1 above will be described, and similar portions will not be described again. Accordingly, the effect of the similar portions, and modification examples, are the same as those of the working example described above.

The crystal vibrator 1 shown in FIGS. 5 and 6 comprises the crystal resonator plate 2, the base 11 that holds the crystal resonator plate 2, and the lid 12 that is used for airtightly sealing the crystal resonator plate 2 held on the base 11.

With this crystal vibrator 1, as shown in FIGS. 5 and 6, a package (housing) is produced by joining the base 11 to the lid 12, and an internal space 13 is formed within this package. The crystal resonator plate 2 is held on the base 11 in this internal space 13, and the internal space 13 of the package is airtightly sealed. The base 11 and the crystal resonator plate 2 here are joined using an electroconductive bump 18.

The electroconductive bump 18 is a gold or other metal bump or a plating bump, and the crystal resonator plate 2 is electromechanically joined to the base 11 by the electroconductive bump 18. Alternatively, solder or another metal bump or a plating bump is used for the electroconductive bump 18, and the crystal resonator plate 2 is electromechanically joined to the base 11 via the electroconductive bump 18 by thermal joining.

The substrate 21 of the crystal resonator plate 2 is made up of two leg components 221 and 222 and a base component 23, and is formed with the two leg components 221 and 222 protruding from the base component 23. With this substrate 21, the size in the width direction (the ±X axial directions) is the same for the base component 23 as that for the leg components 221 and 222. Specifically, the side faces of the substrate 21 are straight, formed in the same plane from the side faces of the leg components 221 and 222 to the side ends 231 and 232 of the base component 23.

Also, as shown in FIGS. 5 and 6, eight through-holes 234 are made in the base component 23, passing from its front main face 241 to its rear main face 242. More specifically, these through-holes 234 are formed in the ±X axial directions from the side ends 231 and 232 of the base component 23. Also, these through-holes 234 are formed four each in the ±Y axial directions in the side ends 231 and 232. The length of at least one of these through-holes 234 in the ±X axial directions is greater than the length in the ±X axial directions of the other adjacent through-holes 234 on the +Y axial direction side thereof. More specifically, the length in the ±X axial directions of the through-holes 234 formed on the leg component side of the base component 23 is greater than the length of the other through-holes 234 in the ±X axial directions.

Next, the above-mentioned placement of the crystal resonator plate 2 in the package will be described through reference to the drawings.

The crystal resonator plate 2 is placed on the base 11 constituted as above. At this time, the +X axial direction of the crystal resonator plate 2 inside the internal space 13 is set for the placement of the crystal resonator plate 2 on the base 11 (what is called the setting step in the present invention). Here, the disposition of the crystal resonator plate 2 in the internal space 13 is set in the direction indicated in FIG. 5 by the +X axial direction of the crystal resonator plate 2. More specifically, when the crystal resonator plate 2 in the internal space 13 is held at one end by the base component 23 with respect to the base 11, and the base component 23 of the crystal resonator plate 2 that is thus held at one end is disposed on the lower side of the base 11 when the base 11 is viewed in plan view, as in FIG. 5, the +X axial direction of the crystal resonator plate is set in a direction facing from the left side to the right side of the base 11. Also, the +X axial direction of the crystal resonator plate 2 is determined by using the above-mentioned identification portion (the notch 264) (this is called the identification step in the present invention).

Then, the +X axial direction of the crystal resonator plate 2 is aligned with the +X axial direction set in the setting step, and the crystal resonator plate 2 is held on the base 11 (called the holding step in the present invention). In this holding step, the lead electrodes 291 and 292 of the crystal resonator plate 2 and the electrode pads 161 and 162 of the base 11 are joined with the electroconductive bump 18, and as shown in FIG. 5, the crystal resonator plate 2 is held at one end at the base component 23 on the base 11.

After the holding step, the lid 12 is placed on the top face of the wall portions of the base 11, and the lid 12 and the base 11 are joined with solder by seam welding, beam welding, or another such process to manufacture the crystal vibrator 1 shown in FIG. 6. The internal space 13 of this crystal vibrator 1 is sealed airtight.

As shown in the other working example given above, when the crystal resonator plate 2 in which the through-holes 234 have been formed is joined to the base 11, using the electroconductive bump 18 rather than the electroconductive adhesive 14 is preferable in terms of increasing the electromechanical joint strength between the crystal resonator plate 2 and the base 11. Also, with the other working example given above, since the length of the base component 23 in the ±Y axial directions shown in FIG. 5 is greater than that in the first working example given above, impact is less of a factor with the constitution of the other working example given above than with the first working example given above, and as a result, the change in frequency upon impact can be reduced even when the through-holes 234 are provided instead of the grooves 233.

The present invention can be worked in a variety of other forms without going beyond the spirit (gist) of the main features thereof. Accordingly, the working examples given above are in all ways nothing more than examples, and should not be construed to be limiting in nature. The scope of the present invention is that given in the Claims, and is not restricted in any way to the content of this Specification. Furthermore, modifications and alterations equivalent to the Claims are all within the scope of the present invention.

Also, this application claims prior right on the basis of Japanese Patent Application 2005-231754, submitted in Japan on Aug. 10, 2005, the content of which is hereby incorporated in its entirety by reference herein.

INDUSTRIAL APPLICABILITY

The present invention can be applied to a piezoelectric resonator device such as a tuning fork-shaped crystal vibrator, and to a method for manufacturing such a device.

The invention claimed is:

1. A piezoelectric resonator device, in which a package having an internal space is made up of a base and a lid, and a piezoelectric resonator plate is held on the base inside the internal space, wherein an +X axial direction of the piezoelectric resonator plate in the internal space is set and wherein the piezoelectric resonator plate is made up of a base component and a plurality of leg components that protrude from the base component, excitation electrodes having different potential are formed on the leg components, lead electrodes that are drawn from the excitation electrodes in order to electrically connect the excitation electrodes with external electrodes at the base component are formed on the base component and the leg components, and a groove is formed in a front main face of the base component from at least one side face in the .+−.X axial directions, wherein no grooves are formed in the rear main face.

2. The piezoelectric resonator device according to claim 1, wherein the piezoelectric resonator plate is provided with an identification portion visible from a plan view perspective for identifying the +X axial direction.

3. The piezoelectric resonator device according to claim 2, wherein the piezoelectric resonator plate is made up of a base component and a plurality of leg components that protrude from the base component, and the identification portion is provided to protruding ends of the leg components.

4. The piezoelectric resonator device according to claim 3, wherein the protruding ends each include a protruding end face and .+−.X axial side faces, and the identification portion is a slit formed extending from the protruding end face to the -X axial side face.

5. The piezoelectric resonator device according to claim 1, wherein a plurality of the grooves are formed in the front main face of the base component in the .+−.Y axial directions.

6. The piezoelectric resonator device according to claim 5, wherein the length of at least one of the grooves in the .+−.X axial directions is greater than the length in the .+−.X axial directions of the other grooves adjacent on the .+−.Y axial direction sides.

7. The piezoelectric resonator device according to claim 1, wherein the lead electrodes and external electrodes are electrically connected at opposing locations on a rear main face of the base component across from the locations where the grooves are formed in the front main face.

8. The piezoelectric resonator device according to claim 2, wherein the piezoelectric resonator plate is made up of a base component and a plurality of leg components that protrude from the base component, excitation electrodes having different potential are formed on the leg components, lead electrodes that are drawn from the excitation electrodes in order to electrically connect the excitation electrodes with external electrodes at the base component are formed on the base component and the leg components, and a groove is formed in a front main face of the base component from at least one side face in the .+−.X axial directions.

9. The piezoelectric resonator device according to claim 3, wherein the piezoelectric resonator plate is made up of a base component and a plurality of leg components that protrude from the base component, excitation electrodes having different potential are formed on the leg components, lead electrodes that are drawn from the excitation electrodes in order to electrically connect the excitation electrodes with external electrodes at the base component are formed on the base component and the leg components, and a groove is formed in a front main face of the base component from at least one side face in the .+−.X axial directions.

10. The piezoelectric resonator device according to claim 4, wherein the piezoelectric resonator plate is made up of a base component and a plurality of leg components that protrude from the base component, excitation electrodes having different potential are formed on the leg components, lead electrodes that are drawn from the excitation electrodes in order to electrically connect the excitation electrodes with external electrodes at the base component are formed on the base component and the leg components, and a groove is formed in a front main face of the base component from at least one side face in the .+−.X axial directions.

11. The piezoelectric resonator device according to claim 5, wherein the lead electrodes and external electrodes are electrically connected at opposing locations on a rear main face of the base component across from the locations where the grooves are formed in the front main face.

12. The piezoelectric resonator device according to claim 6, wherein the lead electrodes and external electrodes are electrically connected at opposing locations on a rear main face of the base component across from the locations where the grooves are formed in the front main face.

13. The piezoelectric resonator device according to claim 8, wherein the lead electrodes and external electrodes are electrically connected at opposing locations on a rear main face of the base component across from the locations where the grooves are formed in the front main face.

14. The piezoelectric resonator device according to claim 9, wherein the lead electrodes and external electrodes are electrically connected at opposing locations on a rear main face of the base component across from the locations where the grooves are formed in the front main face.

15. The piezoelectric resonator device according to claim 10, wherein the lead electrodes and external electrodes are electrically connected at opposing locations on a rear main face of the base component across from the locations where the grooves are formed in the front main face.

16. The piezoelectric resonator device according to claim 8, wherein a plurality of the grooves are formed in the front main face of the base component in the .+−.Y axial directions.

17. The piezoelectric resonator device according to claim 9, wherein a plurality of the grooves are formed in the front main face of the base component in the .+−.Y axial directions.

* * * * *